(12) United States Patent  
Masuda et al.

(10) Patent No.: US 7,198,816 B2  
(45) Date of Patent: Apr. 3, 2007

(54) DROPLET EJECTION METHOD OF FORMING A FILM

(75) Inventors: Takashi Masuda, Suwa (JP); Katsuyuki Morii, Suwa (JP)

(73) Assignee: Seiko Epson Corporation (JP)

( * ) Notice: Subject to any disclaimer, the term of this patent is extended or adjusted under 35 U.S.C. 154(b) by 113 days.

(21) Appl. No.: 10/310,121

(22) Filed: Dec. 4, 2002

(65) Prior Publication Data

US 2003/0151650 A1   Aug. 14, 2003

(30) Foreign Application Priority Data

| Dec. 5, 2001 | (JP) | 2001-371905 |
| Dec. 13, 2001 | (JP) | 2001-380528 |
| Dec. 13, 2001 | (JP) | 2001-380529 |
| Dec. 13, 2001 | (JP) | 2001-380530 |
| Dec. 3, 2002 | (JP) | 2002-351479 |

(51) Int. Cl.  
*B05D 5/12* (2006.01)  
*B05D 1/04* (2006.01)

(52) U.S. Cl. ............... 427/97.3; 427/98.4; 427/261; 427/265; 427/466

(58) Field of Classification Search ............... 427/466, 427/261, 265, 287, 97.7, 97.3, 98.4, 117  
See application file for complete search history.

(56) References Cited

U.S. PATENT DOCUMENTS

| 2,371,153 | A | * | 3/1945 | Connelly | ............... | 434/84 |
| 5,997,136 | A | * | 12/1999 | Fujisawa et al. | ............... | 347/101 |
| 6,153,263 | A | * | 11/2000 | Haruta et al. | ............... | 427/261 |
| 6,599,582 | B2 | * | 7/2003 | Kiguchi et al. | ............... | 427/466 |
| 6,599,780 | B2 | * | 7/2003 | Morii | ............... | 438/131 |
| 2002/0151161 | A1 | * | 10/2002 | Furusawa | ............... | 438/597 |

OTHER PUBLICATIONS

"High Resolution Inkjet Printing of All-Polymer Transistor Circuits", H. Sirringhaus et al, SCINECE, vol. 290, pp. 2123-2126, Dec. 15, 2000.*

* cited by examiner

*Primary Examiner*—Fred J. Parker  
(74) *Attorney, Agent, or Firm*—Harness, Dickey & Pierce, P.L.C.

(57) ABSTRACT

A droplet ejection patterning method of ejecting a dispersion formed by dispersing a convectable dispersoid in a dispersion medium onto a substrate including a lyophilic region and a lyophobic region. Due to a concentration difference of the dispersion, the dispersoid convects within the dispersion medium toward the edges of the dispersion to form narrow lines of the dispersoid without using photolithography.

5 Claims, 4 Drawing Sheets

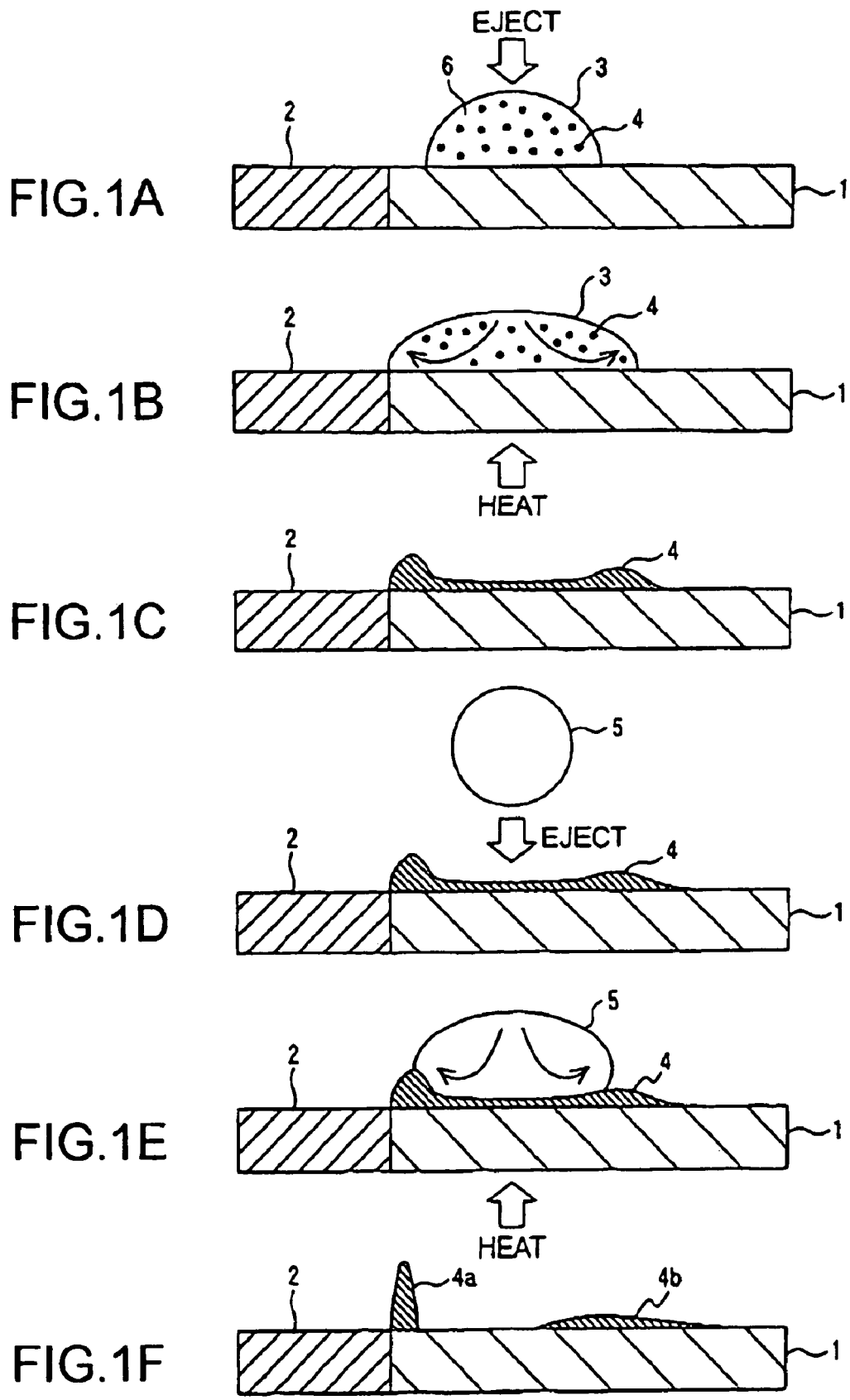

|  | | 50°C | 70°C | 90°C | 150°C |
|---|---|---|---|---|---|
| UV irradiated Si | Add Tetradecane | △ | ○ | ○ | × |
| | Add 1,2,3,4Tetramethylbenzen | △ | △ | △ | ○ |
| | Add H₂O | | | | |
| | Add Ethanol | △ | ○ | × | × |
| FAS-coated Si | Add Tetradecane | △ | ○ | ◎ | × |
| | Add 1,2,3,4Tetramethylbenzen | △ | △ | △ | ◎ |
| | Add H₂O | | | | |
| | Add Ethanol | △ | ○ | × | × |

FIG.3

DROPLET EJECTION METHOD OF FORMING A FILM

FIELD OF THE INVENTION

The present invention relates to a droplet ejection apparatus, a pattern formation apparatus, a wiring formation apparatus, a pattern formation medium, a droplet ejection method, a patterning method, and a wiring formation method and more specifically to ones suitable for use when forming fine lines.

DESCRIPTION OF THE PRIOR ART

As a method of pattering method using a conventional ink jet method, U.S. Pat. No. 5,132,248 discloses a method where a liquid in which micro-particles are dispersed is directly pattern-coated on a substrate by an inkjet method, and the pattern subsequently is converted to a conducting layer pattern by performing heat treatment or laser irradiation.

This method makes it possible to form patterns without using a photolithographic technique, thereby enabling the pattern formation process to be greatly simplified.

Also, Japanese Laid Open to the Public No. Sho 59-75205 discloses a method where the location of ejected droplets is controlled by forming banks on a substrate so that the accuracy of processing with an ink jet method is improved. When banks are used, the droplets ejected onto the substrate stay within the banks and can form patterns of approximately 30 µm, at a positional accuracy of approximately 1 µm.

In addition, in a method for forming conducting patterns by pattern-coating a liquid containing micro-particles on a substrate, instead of controlling the location of droplets with banks or trenches formed by a photolithographic process as in the prior art, a method has been proposed where a liquid material is selectively coated only on lyophobic areas of a substrate upon which a pattern of lyophobic areas and lyophilic areas has been formed by an organic polymer layer. The pattern is subsequently converted to a conducting layer by heat treatment, thereby forming a conducting pattern with good accuracy by a simple process.

Nevertheless, while the inkjet patterning method described in U.S. Pat. No. 5,132,248 has the advantage of being a simple process that uses a small quantity of raw materials, when banks were not used, the method was limited to the formation of structures having a size no smaller than approximately 100 µm, at a positional accuracy of approximately 30 µm.

Further, the method disclosed in Japanese Laid Open to the Public No. Sho 59-75205 had the disadvantage of being costly, since the banks on the substrate needed to be formed using photolithography.

In addition, the method of forming patterns of lyophobic areas and lyophilic areas on a substrate by an organic polymer layer was incapable of forming lines any narrower than an order of several tens of microns, due to limitations on the size of the diameter of the inkjet head nozzles.

DISCLOSURE OF THE INVENTION

With this background, the purpose of the present invention is to provide a droplet ejection apparatus, a pattern formation apparatus, a wiring formation apparatus, a droplet ejection method, a patterning method, and a wiring formation method that are capable of forming micron-order or sub-micron order lines by ejecting droplets.

In order to solve the above-mentioned problems, an apparatus for ejecting a droplet according to the preferred embodiment of the present invention comprises a droplet ejection means for ejecting a droplet formed by dispersing a dispersoid or a droplet formed by dissolving a solute, and a dispersion medium or solvent medium ejection means for ejecting a dispersion medium or a solvent medium in a location where the droplet is ejected.

According to this apparatus, after the droplet formed by dispersing the dispersoid or the droplet formed by dissolving the solute is ejected, the concentration and viscosity of the ejected droplet can be controlled, and the dispersoid or the solute within the droplet can be efficiently convected.

Furthermore, by selecting the suitable dispersion medium or solvent medium, the dispersoid or the solute can be efficiently convected within only the droplet that was first ejected.

Therefore, the dispersoid or the solute can be moved to the droplet interface, enabling the efficient aggregation of the dispersoid or the solute at the droplet interface, making it possible to accurately form a dispersoid or solute pattern that corresponds to the droplet interface.

In addition, a pattern formation apparatus according to a preferred embodiment of the present invention comprises a dispersion or solution ejection means for ejecting a dispersion or a solution such that the interface of the dispersion formed by dispersing a dispersoid or a solution formed by dissolving a solute follows a prescribed pattern, and a dispersoid or solute aggregation means for aggregating the dispersoid or the solute at the interface of the dispersion or solution.

This apparatus enables the formation of lines and dots of the dispersoid or the solute along the interface of the dispersion medium with the dispersed dispersoid or the solvent medium with the dissolved solute and enables the line width and dot shape of the dispersoid or the solute to be regulated without limiting the size of droplets at the time of ejection.

Therefore, the use of an inkjet method to form patterns enables fine lines to be formed with good accuracy and, because the need for patterning using photolithography is obviated, enables micropatterns to be formed at lower cost.

In addition, according to a pattern formation apparatus of a preferred embodiment of the present invention, the dispersoid or solute aggregation means is a drying means for drying the ejected dispersion or solution.

According to this apparatus, ejecting a dispersion medium with the dispersed dispersoid or the solvent medium with the dissolved solute makes it possible to convect the dispersoid or the solute within the ejected dispersion medium or solvent medium and to form dispersoid or solute lines along the interface of the dispersion medium or the solvent medium, thereby enabling the linewidth and dot shape of the dispersoid or the solute to be regulated without limiting the size of droplets at the time of ejection.

Therefore, the use of an inkjet method to form a pattern enables fine lines to be formed with good accuracy and, because the need for patterning using photolithography is obviated, enables micropatterns to be formed at lower cost.

In addition, according to a pattern formation apparatus of a preferred embodiment of the present invention, the dispersoid or solute aggregation means is a heating means for heating the ejected dispersion or solution.

According to this apparatus, after the droplet formed by dispersing the dispersoid or the droplet formed by dissolving the solute is ejected, the gas state and viscosity of the ejected droplet can be controlled, and the dispersoid or the solute within the droplet can be efficiently convected, depending on the kind of the dispersion medium with the dispersed dispersoid or solvent medium with the dissolved solute.

Therefore, the dispersoid or the solute is moved to the droplet interface, enabling the efficient aggregation of the dispersoid or the solute at the droplet interface, and making it possible to accurately form the dispersoid or solute pattern that corresponds to the droplet interface.

In addition, according to a pattern formation apparatus of a preferred embodiment of the present invention, the dispersoid or solute aggregation means is a partial pressure control means for controlling the partial pressure of the ejected dispersion or solution.

According to this apparatus, after the droplet formed by dispersing a dispersoid or the droplet formed by dissolving the solute is ejected, the gas state of the ejected droplet can be controlled without heating the droplet to high temperature, the dispersoid or the solute within the droplet can be efficiently convected, depending on the kind of the dispersion medium with the dispersed dispersoid or the solvent medium with the dissolved solute.

Therefore, even where the dispersoid or the solute contains a material that is vulnerable to temperature such as a functional polymer, the dispersoid or the solute is moved to the droplet interface, enabling the efficient aggregation of the dispersoid or the solute at the droplet interface, and making it possible to accurately form a dispersoid or solute pattern that corresponds to the droplet interface.

In addition, according to a pattern formation apparatus of a preferred embodiment of the present invention, the dispersoid or solute aggregation means is a dispersion medium or solvent medium ejection means for ejecting a dispersion medium or a solvent medium in the position where the dispersion or solsolution is ejected.

According to this apparatus, after the dispersion formed by dispersing the dispersoid or the solution formed by dissolving the solute is ejected, the concentration and viscosity of the ejected dispersion or solution can be controlled, making it possible to efficiently convect the dispersoid or the solute within the dispersion medium or the solvent medium and aggregate the dispersoid or the solute at the dispersion medium or solvent medium interface. Hence, it is thereby possible to reconvect insufficiently the aggregated dispersoid or solute at the dispersion medium or solvent medium interface, and gather up the dispersoid or the solute at the dispersion medium or solvent medium interface.

This makes it possible to improve controllability when aggregating the dispersoid or the solute at the dispersion medium or solvent medium interface, and enables improved accuracy when forming micropatterns while achieving lower costs at the time of micropattern formation.

In addition, according to a pattern formation apparatus of a preferred embodiment of the present invention, the pattern interface has a physical or chemical barrier that controls the movement of the dispersion or the solution.

This barrier makes it possible, depending on the properties of the dispersion medium or the solvent medium ejected on to the substrate, to consistently impede the dispersion medium or solvent medium at a prescribed location, enabling the position of the interface of the dispersion medium or the solvent medium ejected on to the substrate to be aligned along a prescribed pattern.

Therefore, the line position and linewidth of the dispersoid or the solute can be regulated with good accuracy without limiting the size of droplets at the time of ejection; and, moreover, an inkjet method can be used to eject droplets to form sub-micron order lines with good accuracy and achieve micropattern formation at low cost, as the need for a high-resolution exposure system is obviated.

In addition, according to a pattern formation apparatus of a preferred embodiment of the present invention, the chemical barrier uses differences in surface energy.

Accordingly, by treating the surface of a substrate, a chemical barrier to the dispersion medium or to the solvent medium can be formed, and sub-micron order lines can be formed with good accuracy and at low cost.

In addition, according to a pattern formation apparatus of a preferred embodiment of the present invention, the chemical barrier uses fluoroalkylsilane.

Accordingly, by selectively treating the surface of a substrate, a pattern of lyophilic areas and lyophobic areas can be formed on a substrate, and by using an inkjet method to eject droplets on a substrate, sub-micron order lines can be formed at low cost and with good accuracy.

In addition, a pattern formation apparatus of a preferred embodiment of the present invention comprises a dispersion or solution ejection means for ejecting the dispersion or the solution such that the interface of a dispersion formed by dispersing a dispersoid in a first dispersion medium or a solution formed by dissolving a solute in a first solvent medium follows a prescribed pattern, and a dispersion medium or solvent medium replenishment means for replenishing a second dispersion medium or a second solvent medium in the position where the dispersion or the solution is ejected.

According to this apparatus, simply replenishing the dispersion medium or the solvent medium in an ejected droplet enables the viscosity, concentration, and so forth of the ejected droplet to be controlled, and, depending on the kind of the dispersion medium with the dispersed dispersoid or solvent medium with the dissolved solute, makes it possible to convect the dispersoid or the solute efficiently within the droplet. Hence, it thereby enables the convection time of the dispersoid or the solute within the dispersion medium or the solvent medium to be controlled.

Therefore, the dispersoid or the solute is moved to the droplet interface, enabling the efficient aggregation of the dispersoid or the solute at the droplet interface and making it possible to form with good accuracy the dispersoid or solute pattern that corresponds to the droplet interface. Hence, it is possible thereby, to form lines with micron order to sub-micron order accuracy without using photolithography.

In addition, according to a pattern formation apparatus of a preferred embodiment of the present invention, the dispersion medium or solvent medium replenishment means ejects the dispersion medium or the solvent medium that is identical to the first dispersion medium or solvent medium.

According to this apparatus, even where the dispersion medium or solvent medium vaporizes along with the convection of the dispersoid or the solute within the dispersion medium or the solvent medium, the convection state of the dispersoid or the solute within the dispersion medium or the solvent medium can be maintained while the viscosity, concentration, and so forth of the ejected droplet is being controlled. Hence, it is possible to efficiently convect the dispersoid or the solute within the droplet.

Therefore, the dispersoid or the solute is moved to the droplet interface, enabling the efficient aggregation of the dispersoid or the solute at the droplet interface, and making it possible to form with good accuracy the dispersoid or solute pattern that corresponds to the droplet interface.

In addition, according to a pattern formation apparatus of a preferred embodiment of the present invention, the dispersion medium or solvent medium replenishment means ejects the dispersion medium or the solvent medium that differs from the first dispersion medium or solvent medium.

According to this apparatus, depending on the state of flocculation of the dispersoid or the solute when the dispersion medium or solvent medium is vaporized, the convection state of the dispersoid or the solute within the dispersion medium or the solvent medium can be controlled, making it possible to efficiently convect the dispersoid or the solute within the droplet.

Therefore, the dispersoid or the solute is moved to the droplet interface, enabling the efficient aggregation of the dispersoid or the solute at the droplet interface and making it possible to form with good accuracy the dispersoid or solute pattern that corresponds to the droplet interface.

In addition, according to a pattern formation apparatus of a preferred embodiment of the present invention, the dispersion medium or solvent medium replenishment means ejects the dispersion medium or the solvent medium a plurality of times on a location where the dispersion or the solution was ejected.

According to this means, even where the dispersion medium or the solvent medium vaporizes along with the convection of the dispersoid or the solute within the dispersion medium or the solvent medium, the convection state of the dispersoid or the solute within the dispersion medium or the solvent medium can be maintained while the viscosity, concentration, and so forth of the ejected droplet is being controlled. Hence, it is possible thereby to convect the dispersoid or the solute within the droplet efficiently, and to control the convection time of the dispersoid or the solute within the dispersion medium or the solvent medium simply by repeatedly ejecting the dispersion medium or the solvent medium.

Therefore, simply ejecting the dispersion medium or the solvent medium causes the dispersoid or the solute to move to the droplet interface, making it possible to efficiently aggregate the dispersoid or the solute at the droplet interface. Further, the dispersoid or the solute remained in locations other than the droplet interface can be removed. Hence, it is possible to form with good accuracy the dispersoid or solute pattern that corresponds to the droplet interface, without the use of photolithography.

In addition, according to a pattern formation apparatus of a preferred embodiment of the present invention, the dispersion medium or solvent medium replenishment means ejects a plurality of kinds of dispersion mediums or solvent mediums on a location where the dispersion or solution was ejected.

According to this means, depending on the state of concentration or flocculation of the dispersoid or the solute when the dispersion medium or the solvent medium is vaporized, the convection state of the dispersoid or the solute within the dispersion medium or the solvent medium can be controlled, making it possible to efficiently convect the dispersoid or the solute within the droplet.

Therefore, the dispersoid or the solute is moved to the droplet interface, enabling the efficient aggregation of the dispersoid or the solute at the droplet interface, and making it possible to form with good accuracy the dispersoid or solute pattern that corresponds to the droplet interface.

In addition, according to a pattern formation apparatus of a preferred embodiment of the present invention, the dispersion medium or solvent medium replenishment means ejects the dispersion medium or the solvent medium before the ejected dispersion medium or solvent medium dries.

According to this apparatus even where the properties of the dispersoid or the solute has diffculty in dispersing or dissolving again once the dispersoid or the solute has flocculated and hardened when the dispersion medium or the solvent medium has dried, the dispersoid or the solute can be maintained in a dispersed or dissolved state within the dispersion medium or the solvent medium. Hence, it is possible thereby to control the convection time of the dispersoid or the solute within the ejected dispersion medium or the solvent medium and to improve the accuracy of linewidths and so forth.

In addition, according to a pattern formation apparatus of a preferred embodiment of the present invention, the dispersion medium or solvent medium replenishment means ejects the dispersion medium or the solvent medium after the ejected dispersion medium or solvent medium has dried.

According to this apparatus, even when the dispersoid or the solute did not completely gather at the dispersion medium or solvent medium interface with only a single ejection of the dispersion medium with the dispersed dispersoid or the solvent medium with the dissolved solute, the dispersoid or the solute that did not aggregate at the dispersion medium or solvent medium interface can be reconvected simply by ejecting the dispersion medium or the solvent medium again. Hence, it is possible thereby to gather up the dispersoid or the solute on the dispersion medium or solvent medium interface.

Therefore, micropatterns can be formed along the dispersion medium or solvent medium interface without performing photolithography, making it possible to improve accuracy during micropattern formation while also reducing costs at the time of micropattern formation.

In addition, the wiring formation apparatus of a preferred embodiment of the present invention comprises a dispersion or solution ejection means for ejecting a dispersion or a solution such that the interface of the dispersion formed by dispersing conductive micro-particles or the solution formed by dissolving conductive polymer follows a prescribed pattern, and a conductive micro-particle or conductive polymer aggregation means for aggregating the conductive micro-particles or the conductive polymer at the interface of the dispersion or the solution.

This apparatus enables wiring consisting of conductive micro-particles or conductive polymer to be formed along the interface of the dispersion medium with dispersed micro-particles or the solvent medium with the dissolved conductive polymer, and enable linewidths to be regulated, without limiting the size of droplets at the time of ejection.

Therefore, merely by patterning using an inkjet method, microwiring can be formed with good accuracy, and, because the need for patterning using photolithography is obviated, costs at the time of microwiring formation can be reduced.

In addition, the pattern formation medium according to a preferred embodiment of the present invention comprises a pattern for controlling the movement of a dispersion or a solution at the interface, and a dispersoid or a solute that is formed along the interface of the pattern by convecting within the dispersion or the solution.

Accordingly, ejecting the droplet on a pattern formation medium enables the position of the interface of the dispersion medium or the solvent medium ejected onto the pattern formation medium to be aligned, and enables lines of the dispersoid or the solute to be uniformly formed along the interface of the dispersion medium or the solvent medium.

In addition, the droplet ejection method of a preferred embodiment of the present invention comprises a process for ejecting a droplet formed by dispersing a dispersoid or a droplet formed by dissolving a solute, and a process for ejecting a dispersion medium or a solvent medium on the ejected droplet.

Accordingly, the concentration and viscosity of the ejected droplet can be controlled, as can the convection state of the dispersoid or the solute within the droplet, making it possible to efficiently aggregate the dispersoid or the solute at the droplet interface, thereby enabling the accurate formation of the dispersoid or solute pattern that corresponds to the droplet interface.

In addition, according to the patterning method of a preferred embodiment of the present invention, a pattern of a dispersoid or a solute is formed by ejecting a droplet, formed by dispersing the dipseroid in a convectable dispersion medium, or a droplet, formed by dissolving the solute in a solvent, onto a prescribed location.

Accordingly, simply ejecting the droplet onto the prescribed location enables the aggregation of the dispersoid or the solute at the interface of the droplet and the formation of a pattern of the dispersoid or the solute, making it possible to form lines with micron order to sub-micron order accuracy without using photolithography.

In addition, the patterning method of a preferred embodiment of the present invention comprises a step for ejecting a dispersion or a solution containing a dispersoid or a solute such that the interface of a dispersion medium with the dispersed dispersoid or a solvent medium with the dissolved solute follows a prescribed pattern, and a step for gathering the dispersoid or the solute at the inferface of the dispersion medium or the solvent medium by vaporizing the dispersion medium or the solvent medium.

Accordingly, even where patterning has been performed using an inkjet method, the linewidths of the dispersoid or the solute can be regulated, without being limited by the size of the dispersion or the solution when ejected, enabling microlines to be formed without patterning using photolithography, and thereby enabling costs to be reduced at the time of micropattern formation.

In addition, the patterning method of a preferred embodiment of the present invention comprises a step for forming a fluoroalkylsilane film on a substrate, a step for patterning the fluoroalkylsilane film by selectively irradiating ultraviolet light on the fluoroalkylsilane film, and a step for ejecting a dispersion formed by dispersing a dispersoid or a solution formed by dissolving a solute along the interface of the pattern of the fluoroalkylsilane film.

According to this method, using a fluoro group that is present in the fluoroalkylsilane film surface makes it possible to modify the properties of the substrate surface such that the surface is resistant to wetting. Further, allowing a hydroxyl group to remain on the surface in regions where the fluoroalkylsilane film was removed by exposure to ultraviolet light makes it possible to modify the properties of the substrate surface such that the surface is easily wettable. Hence by selectively irradiating desired areas with ultraviolet light, a pattern of lyophilic areas and lyophobic areas can be formed on the substrate.

Therefore, ejecting a dispersion medium with the dispersed dispersoid or the solvent medium with the dissolved solute on to the substrate makes it possible to impede the dispersion medium or the solvent medium at the interface of the fluoroalkylsilane film, aggregate the dispersoid or the solute at the interface of the fluoroalkylsilane film, and easily form sub-micron order fine lines, without using an expensive exposure system such as an X-ray exposure system or electron beam exposure system.

In addition, the wiring formation method of a preferred embodiment of the present invention comprises a step for ejecting a dispersion or a solution such that the interface of the dispersion formed by dispersing conductive micro-particles or the solution formed by dissolving a conductive polymer follows a prescribed pattern, and a step for aggregating the conductive micro-particles or conductive polymer at the interface of a dispersion medium or a solvent medium by vaporizing the dispersion medium or the solvent medium contained in the dispersion or the solution.

According to these steps, even where patterning has been performed using an inkjet method, the width of wiring composed of conductive micro-particles or conductive polymer can be regulated, without being limited by the size of the dispersion medium or the solvent medium at the time of ejection. Hence, microwiring can be formed without patterning by using photolithography, thereby enabling costs to be reduced at the time of microwiring formation.

In addition, according to the wiring formation method of a preferred embodiment of the present invention, the conductive micro-particles are coated with an organic film.

This coating can restrain the flocculation of conductive micro-particles when the conductive micro-particles are dispersed within a dispersion medium, enabling the conductive micro-particles to be efficiently convected within the dispersion medium.

In addition, according to the wiring formation method of a preferred embodiment of the present invention, the grain diameter of the conductive micro-particles is in a range of 1–5000 nm.

This enables the conductive micro-particles to be efficiently dispersed in the dispersion medium, and enables conductive micro-particles to be aggregated at the interface of the dispersion medium.

BRIEF DESCRIPTION OF THE DRAWINGS

FIG. 1A–FIG. 1F are sectional views of the line formation steps in accordance with the first preferred embodiment of the present invention.

FIG. 3 is a table of experimental results for line formation method in accordance with a preferred embodiment of the present invention.

DETAILED DESCRIPTION OF THE PREFERRED EMBODIMENTS

Figure 2A:
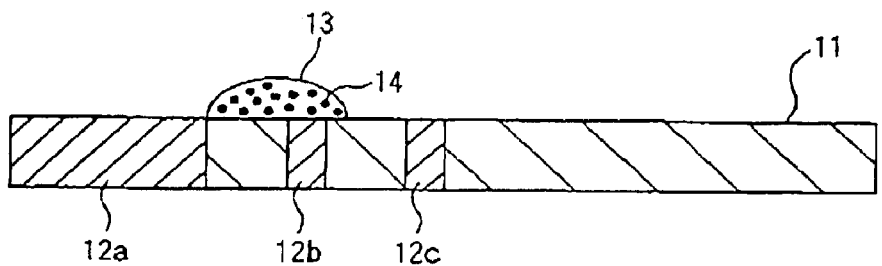
FIG. 2A–FIG. 2D are sectional views of the line formation steps in accordance with the second preferred embodiment of the present invention.

The line formation method of the preferred embodiment of the present invention is described below, with reference to the figures.

FIG. 1A–FIG. 1F are sectional views of the line formation steps in accordance with the first preferred embodiment of the present invention.

In FIG. 1A, a lyophobic region 2 is disposed on a substrate 1, the lyophobic region 2 being arranged such that the interface of the lyophobic region 2 follows the line 4a formed in FIG. 1F. Then, using an inkjet method or similar method, a dispersion 3 formed by dispersing a dispersoid 4 in a dispersion medium 6 is ejected onto the lyophilic region of the substrate 1.

Then, when the dispersion 3 formed by dispersing the dispersoid 4 is ejected onto the lyophilic region of the substrate 1, the dispersion 3 spreads over the lyophilic region of the substrate 1 until it reaches the interface with the lyophobic region 2, whereupon it is impeded, as shown in FIG. 1B.

Here, the kind and viscosity of the dispersion medium 6 formed by dispersing the dispersoid 4, or the concentration of the dispersoid 4 dispersed in the dispersion medium 6, can be selected such that the dispersoid 4 within the dispersion medium 6 is convectable.

Therefore, due to a concentration difference of the dispersion 3 landing on the substrate 1, the dispersoid 4 convects within the dispersion medium 6, becoming heavily concentrated at the edges of the dispersion, and the dispersoid 4 aggregates at the interface of the dispersion 3 on the substrate 1.

In addition, when the substrate 1 on which the dispersion 3 has landed is heated, the convection of the dispersoid 4 within the dispersion medium 6 is further accelerated, causing even more dispersoid 4 to aggregate at the interface of the dispersion 3 on the substrate 1.

Then, as shown in FIG. 1C, only the dispersion medium 6 vaporizes and only the dispersoid 4 is left on the substrate 1, with the dispersoid 4 raised in the vicinity of the interface of the dispersion 3.

Next, as shown in FIG. 1D, a dispersion medium 5 is ejected onto the dispersoid 4 remaining on the substrate 1. As a result, the dispersoid 4 near the center is taken up into the dispersion medium 5, dispersing the dispersoid 4 into the dispersion medium 5.

Then, as shown in FIG. 1E, when the substrate 1 upon which the dispersion medium 5 has landed on the dispersoid 4 is heated, the dispersoid 4 dispersed within the dispersion medium 5 again convects, and the dispersoid 4 that remained near the center is driven to both sides.

The dispersoid 4 is then completely driven to both sides by repeated additional injections and heat drying of the dispersion medium 5, and, as shown in FIG. 1F, lines 4a, 4b are formed in a position corresponding to the interface of both sides of the dispersion 3.

Accordingly, convecting the dispersoid 4 within the dispersion medium 6 and the dispersion medium 5 enables the formation of lines 4a, 4b that are more narrow than the line formed by the continuous dispersion 3, making it possible to create narrow lines of dispersoid 4 without using photolithography. Hence, it is possible thereby to attain lower cost at the time of micropattern formation.

Here, where the dispersion medium 5 is to be ejected onto the substrate 1 after the dispersion 3 has been ejected onto the substrate 1, the dispersion medium 6 may be used as the dispersion medium 5, or a dispersion medium 5 that is different from the dispersion medium 6 may be used.

Furthermore, where the dispersion medium 5 is to be ejected onto the substrate 1, the dispersion medium 5 may be ejected multiple times onto the substrate 1, or a plurality of kinds of the dispersion mediums 5 may be ejected in combination.

Furthermore, as for the timing for ejecting the dispersion medium 5 onto the substrate 1 following the ejection of dispersion 3 onto the substrate, the dispersion medium 5 may be ejected onto the substrate 1 after the dispersion medium 6 has fully dried. But the dispersion medium 5 may be ejected onto the substrate 1 before drying the dispersion medium 6.

According to this process, even where the dispersoid 4 has the property of difficulty in redispersing in the dispersion medium 5 once the dispersoid 4 has flocculated and hardened when the dispersion medium 6 has dried, the dispersoid 4 can be dispersed within the dispersion medium 5. Hence, it is possible to control the convection time of the dispersoid 4 within the dispersion medium 5 so as to improve the accuracy of linewidths and so forth.

In addition, depending on the state of convection and the state of flocculation of the dispersoid 4, the dispersion medium 5 may be ejected while changing such parameters as the timing of ejecting the dispersion medium 5 and the volume of dispersion medium 5 ejected, and they may be performed in combination with heating or evacuating and so forth.

Furthermore, since there is a limit to the amount of dispersoid 4 that can be dispersed into the dispersion medium 6, if the required amount of dispersoid 4 cannot be landed on the substrate 1 with only a one-time ejection of the dispersion 3, the dispersion 3 formed by dispersing the dispersoid 4 may be repeatedly ejected on top of the dispersoid 4 that has remained on the substrate 1.

Furthermore, in order to cause the dispersoid 4 to convect within the dispersion medium 6 and aggregate the dipseroid 4 at the interface of the dispersion 3, the dispersion medium 6 may simply be allowed to dry naturally, but the dispersion medium 6 may also be force-dried.

Furthermore, depending on the grain diameter of the dispersoid 4, or on the vaporizing temperature and viscosity of the dispersion medium 6, the dispersion medium 6 may be forced-dried and its convection may be controlled similutanously by heating the dispersion medium 6. As a method of heating the dispersion medium 6, the substrate 1 may be heated on a hotplate, or may be lamp heated using a lamp such as a halogen lamp. In addition, the dispersion medium 6 may be laser-heated by irradiating it with laser light.

Furthermore, in order to control the convection of the dispersoid 4 within the dispersion medium 6, the partial pressure of the dispersion medium 6 may be controlled, and, for example, the dispersion medium 6 may be dried during evacuating.

Moreover, as a substrate 1, a silicon or other semiconductor wafer, quartz glass, plastic film, metal plate or a variety of other kinds of substrate can be used, and a semiconductor film, a metal film, a dielectric film, an organic film or other film may be formed as an underlayer on the surface of the substrate 1.

Furthermore, as for the dispersoid 4 used herein, a metallic micro-particle containing any of gold, silver, copper, palladium, or nickel can be used, as can a conductive polymer, superconducting micro-particle, microcapsule, fullerene, carbon nanotube, dendrimer, and so forth. Moreover, to make the dispersoid 4 easily disperse in the dispersion medium 6, an organic substance and so forth may also be used to coat the surface of the micro-particles.

Furthermore, from the standpoint of ease of dispersion of the dispersoid 4 in the dispersion medium 6 and application of the inkjet method when the dispersoid 3 is applied to the substrate 1, the grain diameter of micro-particles is preferably in the range of 1–5000 nm.

Furthermore, the dispersion medium 6 or the dispersion medium 5 is a medium capable of dispersing the dispersoid 4 without causing it to flocculate and is not specifically defined. These materials for it are; water; alcohols such as methanol, ethanol, propanol, or butanol; hydrocarbon type solvents such as n-heptane, n-octane, decane, toluene, xylene, cymene, durene, indene, dipentene, tetrahydronaphthalene, decahydronaphthalene, or cyclohexylbenzene; also ether type solvents such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis (2-methoxyethane) ether, or p-dioxane; and, moreover, polar solvents such as propylene carbonate, γ-butyrolactone, N-methyl-2-pyrrolidone, dimethyl formamide, dimethyl sulfoxide, or cyclohexanon.

Among these, alcohols, hydrocarbon type solvents and ether type solvents are preferred for their ability to disperse micro-particles, for their dispersion stability, and for the ease with which they can be applied to the inkjet method. Moreover, hydrocarbon type solvents can be cited as a preferable solvent. These solvents can be used singly, or as a mixture of two or more types.

Furthermore, the solute concentration where the dispersoid 4 is dispersed in the dispersion medium 6 is preferably 1 weight percent or less, and the viscosity of the dispersion medium 6 wherein the dispersoid 4 is dispersed is preferably about 6 mPa·s. Also, depending on the width and thickness of fabricated lines, the concentration of the dispersoid and the viscosity of the dispersion medium can be suitably adjusted.

Furthermore, by disposing a lyophobic region 2 on the substrate 1, the dispersion 3 formed by dispersing the dispersoid 4 can be impeded at the interface with the lyophobic region 2, making it possible to concentrate the dispersoid 4 in that boundary. Hence, it is possible thereby to form the dense, smooth line 4a with good accuracy.

Here, the lyophobic region 2 has a physical or chemical barrier at this interface, and the physical barrier can, for example, be formed by disposing a step on the substrate 1, and the chemical barrier can, for example, be formed using differences in surface energy.

For example, the surface of the substrate 1 may be treated such that a chemical barrier is formed on the substrate 1, the movement of the dispersoid 4 within a droplet at the interface of the substrate 1 is controlled so that the dispersoid 4 gathers near the surface treated interface.

Furthermore, the surface of the substrate 1 may be treated such that a chemical barrier is formed on the substrate 1, the movement of the dispersion medium 6 or the dispersion medium 5 within a droplet at the interface of the substrate 1 is controlled, and the dispersoid 4 gathers near the surface treated interface.

Here, as a method of forming a chemical barrier, a self-assembled molecular film that bonds to the substrate 1, for example, an organic molecular film including a monomolecular film, can be used. This film comprises, for example, a bondable functional group on the substrate 1, and, on the opposite side, a functional group such as a lyophilic group or lyophobic group that changes the surface properties (controls the surface energy) of the substrate 1, and a straight chain of carbon or a partially branched carbon chain that links these functional groups.

Furthermore, this organic molecular film is preferably broken down by ultraviolet light irradiation and can easily be patterned using a mask and ultraviolet light irradiation.

The organic molecular film that bonds to the substrate 1, including molecular film formed by self-assembling, consists of a bonding functional group that is reactive to the constituent atoms in the underlayer such as the substrate 1, and other straight-chain molecules. This film is formed by aligning compounds possessing high alignability, due to the interaction of these straight-chain molecules.

Since the self-assembled film, unlike resin films such as a photoresist material, is formed by orienting monomolecules, its film thickness can be extremely thin. Moreover, the film can be made homogenous on the molecular level. In other words, since the same molecules are located on the surface of the film, the surface of the film is uniform and, moreover, can be vested with excellent lyophobic and lyophilic properties, making self-assembled films especially useful for fine-line patterning.

For example, where a fluoroalkylsilane is used as a compound possessing high alignability, the self-assembled film is formed by aligning each of the compounds such that a fluoroalkyl group is located on the surface of the film, so uniform lyophobicity can be imparted to the surface of the film.

The compounds for forming such self-assembled film are fluoroalkylsilanes (hereafter, "FAS") such as heptadecafluoro-1,1,2,2-tetrahydrodecyltriethoxysilane, heptadecafluoro-1,1,2,2-tetrahydrodecyltrimethoxysilane, heptadecafluoro-1,1,2,2-tetrahydrodecyltrichlorosilane, tridecafluoro-1,1,2,2-tetrahydro-octyltriethoxysilane, tridecafluoro-1,1,2,2-tetrahydro-oxyl-trimethoxysilane, tridecafluoro-1,1,2,2-tetrahydro-octyltrichlorosilane, and trifluoropropyltrimethoxysilane.

When any of these compounds are used, it is preferable to use one compound alone, but combinations of two or more compounds may also be used.

Furthermore, using FAS as a compound for forming the self-assembled film is preferable for imparting adhesion with the substrate 1 and good lyophobicity. A pattern of the lyophilic area and the lyophobic area can be created by patterning FAS. The areas where FAS is present become the lyophobic area.

The FAS used here is commonly expressed by the structural formula $R_n SiX_{(4-n)}$. Here, n represents an integer of 1 or more and 3 or less, and X is a hydrolysis group such as a methoxy group, an ethoxy group, or a halogen atom. In addition, R is a fluoroalkyl group, has a structure of $(CF_3)(CF_2)_x(CH_2)_y$ (where, x represents an integer of 0 or more and 10 or less, and y expresses an integer of 0 or more and 4 or less), and where a plurality of R or X are coupled with Si, R or X may be the same, respectively, or may be different.

The hydrolysis group represented by X can form silanol by means of hydrolysis, react with the hydroxyl group in the underlayer of the substrate (glass, silicon) and so forth, and bond with the substrate via siloxane bonds.

Furthermore, since R has a fluoro group such as $(CF_3)$ on the surface, the properties of the underlayer surface of the substrate and so forth can be modifed to form an unwettable surface (has low surface energy).

On the other hand, in a region where the self-assembled film is removed by ultraviolet light and so forth, the hydroxyl group remains on the surface. The region, therefore, exhibits extreme wettability compared to the FAS region. Consequently, when FAS is removed from some areas of a substrate 1 that has been completely covered with FAS, a region where FAS was removed exhibits lyophilicity, thereby enabling the formation on the substrate 1 of a pattern containing both the lyophilic area and the lyophobic area.

Moreover, the wavelength of ultraviolet light when FAS is removed is preferably 310 nm or less, and, more preferably, is 200 nm or less FIG. 2A–FIG. 2D are sectional views of the line formation steps in accordance with the second preferred embodiment of the present invention.

In FIG. 2A, lyophobic regions 12a–12c are disposed on the substrate 11 at prescribed space intervals. Then, using a method such as an inkjet method, the dispersion medium 13 is ejected onto the substrate 11 such that one edge of the dispersion medium 13 where the dispersoid 14 is dispersed abuts on the border of the lyophobic region 12a, and the other edge of the dispersion medium 13 extends across the lyophobic region 12b.

Figure 2B:
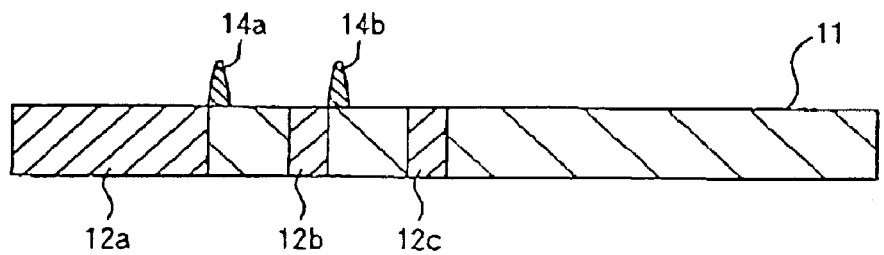

Then, the substrate 11 on which the dispersion medium 13 has impacted is heated while an organic solvent is additionally injected, thereby causing the dispersoid 14 to aggregate on both sides of the dispersion medium 13. As a result, as shown in FIG. 2B, lines 14a and 14b can be formed in positions corresponding to the interfaces on both sides of the dispersion medium 13.

Figure 2C:
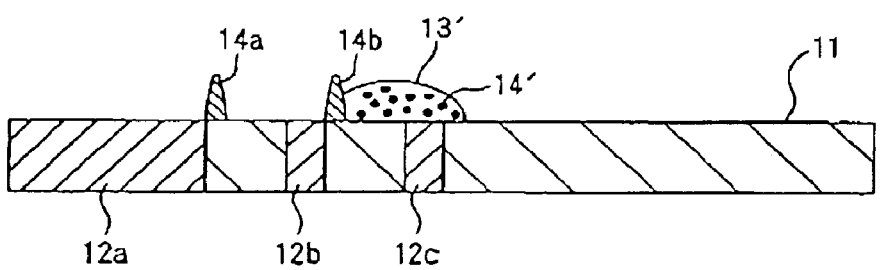

Next, as shown in FIG. 2C, using a method such as an inkjet method, a dispersion medium 13' is ejected onto the substrate 11 such that one edge of the dispersion medium 13' formed by dispersing a dispersoid 14' abuts on the border of lyophobic region 12b,; and the other edge of dispersion medium 13' extends across the lyophobic region 12c.

Figure 2D:
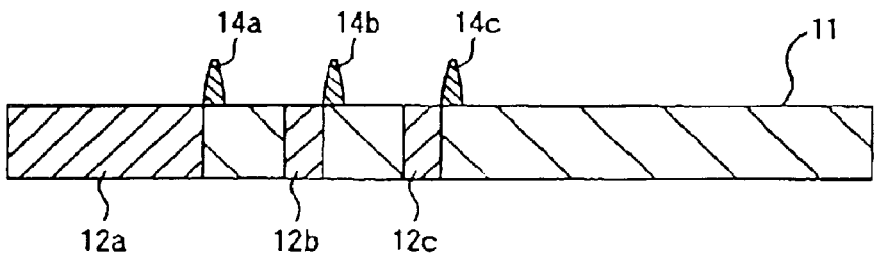

Then, the substrate 11 on which the dispersion medium 13' has impacted is heated while a dispersion medium is additionally injected, thereby causing the dispersoid 14 to aggregate on both sides of the dispersion medium 13'. As a result, as shown in FIG. 2D, the lines 14b and 14c can be formed in positions corresponding to the interfaces on both sides of the dispersion medium 13.

Here, by ejecting the dispersion medium 13' such that the one edge of the dispersion medium 13' abuts the border of the lyophobic region 12b, the position of the line 14b that was formed at one edge of the dispersion medium 13 and the position of the line 14b that will be formed at one edge of the dispersion medium 13' can be made coincident.

For this reason, one of the lines formed on either side of the dispersion medium 13 can be diverted for use when forming lines by ejecting dispersion medium 13', thereby making it possible to alleviate the time and effort of removing one of the lines formed on either side of the dispersion medium 13 and efficiently forming a plurality of lines.

Next, three examples of experimental results for a line formation method in accordance with a preferred embodiment of the present invention will be cited and explained.

First Embodiment (Gold/Tetradecane (Dispersion System))

In a first embodiment, gold (Au) micro-particles having a grain diameter of 8 nm were used as the dispersoid, and tetradecane was used as the dispersion medium. The gold micro-particles were dispersed in the tetradecane to obtain a concentration of 0.1 weight percent gold.

Furthermore, a silicon substrate was used as the substrate on which to eject droplets. A silicon substrate where regions having ink affinity were provided by irradiating the surface with ultraviolet light was prepared, and a silicon substrate where ink affinity regions of 1 cm in width and 3 cm in length were sourrounded by ink repellent regions were provided by patterning with fluoroalkylsilane was prepared.

Tetradecane in which gold micro-particles were dispersed was ejected onto these silicon substrates using an inkjet method. The ejected volume per droplet was 20 picoliters. An "MJ-930C" manufactured by Seiko Epson Corporation was used as the inkjet apparatus.

Furthermore, 100 shots of the tetradecane in which micro-particles were dispersed were successively ejected 10 times, at 35 μm space intervals. Therefore, whereas the pitch during ejection was 35 μm, the diameter of droplets that impacted on the silicon substrate was about 100–200 μm, and the impacted droplets joined to form a continuous line.

Here, on the silicon substrate whose surface was provided with ink affinity by means of ultraviolet light irradiation, the diameter of impacted droplets grew larger than at the time of the first ejection, the size being in proportion to the number of successive ejections.

On the other hand, on the silicon substrate that was patterned with fluoroalkylsilane, droplets that impacted in regions having ink affinity spread out to the border with ink repellent regions, whereupon further spreading was impeded at the border.

Then, following the ejection of droplets onto the silicon substrate, the silicon substrate was heated atop a hotplate at 50 □C, 70 □C, 90 □C, and 150 □C, respectively.

Then, after the landed droplets were dry, a single drop of a dispersion medium (tetradecane) only, or of other dispersion mediums, was dropped from a syringe to the inside of the outer diameter of each dried droplet, after which the droplets were then heated and dried.

Here, (1,2,3,4-tetramethylbenzen), water, ($H_2O$) and ethanol were used as other dispersion mediums that were dropped after the droplets dried.

The additional injection and heat-drying of the dispersion medium only, or of another dispersion medium, was repeated exactly 5 or 6 times.

However, where this was repeated 6 times, on the 6th time the heating temperature was set to 70 degrees Celsius and a single drop of ethanol was dropped.

After the droplet was impacted on the silicon substrate, a step wherein a dispersion medium of tetradecane alone was dropped and heat-dried at 90 degrees Celsius was repeated exactly 5 times, followed by an additional step wherein the heating temperature was set to 70 degrees Celsius and one drop of ethanol was dropped and then dried, resulting in the formation of 0.8 μm lines composed of gold micro-particles on both sides of the dispersion medium.

FIG. 3 is a table of experimental results for a line formation method in accordance with a preferred embodiment of the present invention.

Under the conditions where ⊙ appears in FIG. 3, the dispersoid aggregated on both sides of the dispersion medium that impacted on the silicon substrate. Moreover, by dropping ethanol last, the dispersoid that remained in the center portion of the dispersion medium that impacted on the silicon substrate was divided and pushed aside, or eliminated, thus forming lines on both sides of dispersion medium.

Under the conditions indicated by a ○ in FIG. 3, the dispersoid aggregated on both sides of the dispersion medium that impacted on the silicon substrate, but it did not aggregate locally to the degree that it did under the conditions indicated by a ⊙, nor did it uniformly disperse to the degree that it did under the conditions indicated by a Δ.

Under the conditions indicated by a Δ, the dispersoid stayed uniformly dispersed within the dispersion medium that impacted on the silicon substrate.

Under the conditions indicated by an x, the vaporizing rate of the dispersion medium was too fast, and lines formed by the dispersoid showed up in many layers running toward the inside of the dispersion medium.

Under the conditions indicated by a \, the movement could not be observed, since the surface tension of the dispersion medium was too great, preventing the dispersion medium to wet and spread properly on the silicon substrate.

As a result, selecting a suitable dispersion medium for dispersing a dispersive solute, controlling the temperature, and repeatedly adding and drying the dispersion medium enables the gold micro-particles to aggregate on both sides of the landed dispersion medium, making it possible to achieve sub-micron to micron order thin lines by using a wet-process patterning method that is advantageous in terms of materials and costs.

Second Embodiment (Silica/Water (Dispersion System))

In a second embodiment, micro-particles of silica ($SiO_2$) having a grain diameter of 5 nm were used as the dispersoid. Water was used as the dispersion medium. The dispersion medium was prepared to obtain a concentration of 0.5 weight percent silica. A glass substrate was used as the substrate on which droplets were ejected.

A 10 pl droplet of water in which silica micro-particles were dispersed was ejected onto the glass substrate using an inkjet method. An "MJ-930" manufactured by Seiko Epson Corporation was used as the inkjet apparatus.

Furthermore, 100 droplets of water wherein the micro-particles were dispersed were successively ejected at 35 μm space intervals. Therefore, whereas the pitch at the time of ejection was 35 μm, the diameter of droplets that impacted on the silicon substrate was about 100–200 μm, and the droplets that impacted joined to form a continuous line.

Then, once the droplets on the glass substrate were allowed to dry naturally, 3-μm lines composed of micro-particles of silica were formed on both sides of the dispersion medium.

As a result, selecting a suitable dispersion medium with a dispersed dispersoid enables the efficient aggregation of dispersoid (micro-particles of silica) on both sides of the impacted dispersion medium, even with only a single ejection. Hence, it is possible thereby to achieve sub-micron to micron order thin lines by using a wet-process patterning method that is advantageous in terms of materials and costs.

Third embodiment (poly(9,9-dihexylfluorene))/1,2,3,4-teramethylbenzen (solution system))

In a third embodiment, ADS130BE poly(9,9-dihexylfluorene) manufactured by ADS (American Dye Source, Inc.) and having a molecular weight of approximately 300,000 was used as the dispersoid. 1,2,3,4-teramethylbenzen was used as a solvent. And, poly(9,9-dihexylfluorene) was dissolved in the 1,2,3,4-teramethylbenzen for a concentration of 0.001 weight percent poly(9,9-dihexylfluorene). Furthermore, a silicon substrate was used as the substrate on which to eject droplets. This silicon substrate was prepared by forming a fluoroalkylsilane film on the substrate and by controlling the wettability by irradiating it for 2 minutes with ultraviolet light.

A 10 pl droplet of 1,2,3,4-teramethylbenzen in which poly(9,9-dihexylfluorene) was dissolved was ejected onto this silicon substrate using an inkjet method. An "MJ-930" manufactured by Seiko Epson Corporation was used as the inkjet apparatus.

Furthermore, 100 droplets of 1,2,3,4-teramethylbenzen in which poly(9,9-dihexylfluorene) was dissolved were successively ejected at 35 μm space intervals. Therefore, whereas the pitch at the time of ejection was 35 μm, the diameter of droplets that impacted on the silicon substrate was about 100-200 μm, and the droplets that impacted joined to form a continuous line.

Then, once the droplets on the glass substrate were allowed to dry naturally, the poly(9,9-dihexylfluorene) was able to aggregate on both sides of the dispersion medium.

As a result, selecting a suitable solution formed by dissolving a solute enables the efficient aggregation of solute on both sides of the impacted solvent medium, making it possible to achieve sub-micron to micron order thin lines by using a wet-process patterning method that is advantageous in terms of materials and costs.

Figure 4:
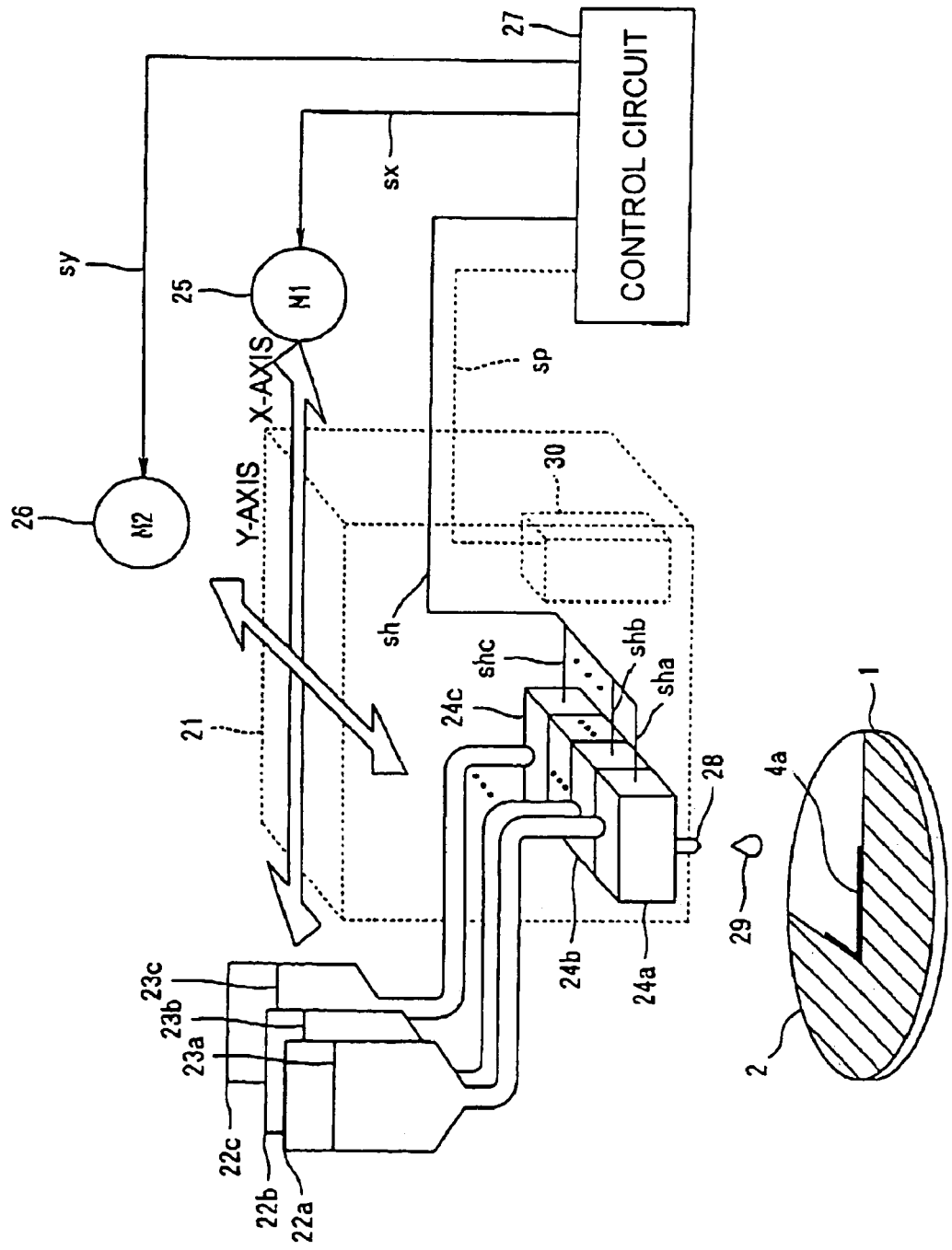
FIG. 4 is a perspective view that shows the schematic configuration of the pattern formation apparatus in accordance with the third preferred embodiment of the present invention.

FIG. 4 is a perspective view that shows the schematic configuration of the pattern formation apparatus in accordance with the third preferred embodiment of the present invention.

Disposed on the pattern formation apparatus in FIG. 4 are a driving mechanism 21, tanks 22a–22c, jet print recording heads 24a–24c, a control circuit 27 and a drying apparatus 30.

Here, the driving mechanism 21, which drives the jet print recording heads 24a–24c in the X-axis direction and in the Y-axis direction, is equipped with motors 25, 26 that move the jet print recording heads 24a–24c in the X-axis direction and in the Y-axis direction.

The tanks 22a–22c, which store a liquid 23a–23c that is ejected via a nozzle 28, are connected to the jet print recording heads 24a–24c. Furthermore, the dispersion 3 formed by dispersing the dispersoid 4 in a dispersion medium, the dispersion medium 6 itself, or the dispersion medium 5, and other liquids can be cited as a liquid 23a–23c that is stored in the tanks 22a–22c.

The jet print recording heads 24a–24c eject the liquid 23a–23c onto a substrate 1 on which the lyophobic regions 2 of FIG. 1 are formed, and the nozzle 28 for ejecting onto a substrate 1 a droplet 29 composed of the liquid 23a–23c is disposed on the jet print recording heads 24a–24c.

Here, the nozzle 28 may be constructed such that it ejects a droplet 29 composed of the liquid 23a–23 based on volume changes caused by a piezoelectric element, or it may be constructed such that it ejects a droplet 29 composed of the liquid 23a–23 based on thermal expansion caused by a heating element.

The control circuit 27 controls the driving mechanism 21, the jet print recording heads 24a–24c, and the drying apparatus 30.

The drying apparatus 30 vaporizes the dispersion medium 6 or the dispersion medium 5 and so forth ejected onto the substrate 1 from the jet print recording heads 24a–24c.

Then, where a line 4a is to be formed on the substrate 1, the tanks 22a–22c are filled with the liquid 23a–23c such as the dispersion 3 formed by dispersing the dispersoid 4 in the dispersion medium 6 or the dispersion medium 5.

Then, the substrate 1 is arranged facing the jet print recording heads 24a–24c, and the liquid 23a–23c eject command is sent to the control circuit 27.

Then, upon receiving the eject command, the control circuit 27 sends drive signals Sx and Sy to the motors 25, 26 and sends eject signals Sha–Shc to the jet print recording heads 24a–24c. Then, as the jet print recording heads 24a–24c are scanned in the X-axis direction and Y-axis direction, the droplet 29 is ejected from the jet print recording heads 24a–24c along the border of the lyophobic region 2.

Moreover, upon receiving drive signals Sx and Sy from the control circuit 27, motors 25, 26 cause the jet print recording heads 24a–24c to scan in the X-axis direction and Y-axis direction via the driving mechanism 21.

Furthermore, upon receiving eject signals Sha–Shc from the control circuit 27, the jet print recording heads 24a–24c eject the droplet 29 via a nozzle 28.

Furthermore, the control circuit 27 sends, where necessary, control signal Sp to the drying apparatus 30. Then, upon receiving control signal Sp, the drying apparatus 30, performing a physical or chemical process on the droplet 29 impacted on the substrate 1, vaporizes the dispersion medium 6 or the dispersion medium 5 or other liquid that has been ejected onto the substrate 1.

Moreover, drying by blasting with cold air, reheating and annealing by irradiating with a lamp, and chemical changes brought about by administering a chemical substance can be cited as examples of physical or chemical processes.

Accordingly, while convecting the dispersoid 4 within the dispersion medium 6 and the dispersion medium 5, the dispersoid 4 can be aggregated at the interface of the dispersion medium 6 or the dispersion medium 5, enabling the formation of sub-micron order fine lines 4a without using photolithography.

Moreover, the method of forming wiring lines was described in the aforesaid embodiment, but the present invention is not limited to the above-mentioned embodiment. A variety of other changes are possible within the scope of the spirit of the present invention.

For example, apart from being used to form wiring lines, the present invention can also be applied to methods for patterning functional molecules and arranging micro-capsules on the single molecule level.

Furthermore, the present invention may be used to create an etching mask for patterning a layer for MOS transistor gate electrodes, thereby making it possible to inexpensively fabricate MOS transistors having sub-micron order gate lengths without using such exposure systems as an X-ray exposure system or electron beam exposure system.

Industrial Applicability

As described above, according to the present invention, by ejecting a droplet in a prescribed location, a dispersion medium or a solute can be aggregated at the interface of a droplet to form a pattern of a dispersion medium or solute, making it possible to form lines with micron order to sub-micron order accuracy without using photolithography.

What is claimed is:

1. A method of forming a film, comprising:
    disposing at least one first droplet on a substrate, the at least one first droplet including a first liquid and a plurality of solid particles, the at least one first droplet contacting an edge of an ink repellent region that is formed on the substrate;
    heating the substrate to evaporate the first liquid of the at least one first droplet to form a first film on the substrate, the first film formed of the plurality of solid particles;
    discharging at least one second droplet including a second liquid to contact the first film and disperse at least some of the plurality of solid particles into the at least one second droplet;
    heating the substrate to evaporate the second liquid of the at least one second droplet to form a second film on the substrate, a shape of the first film and the second film being different; and
    repeating the step of discharging at least one second droplet and the step of heating the substrate step to evaporate the second liquid of the at least one second droplet one after the other to divide the second film into a first portion and a second portion, the first and the second portions not contacting each other, and the first portion contacting the edge of the ink repellent region, the first portion being formed along the edge of the ink repellent region.

2. The method of forming a film according to claim 1, wherein lyophilic property against the first droplet of the ink repellent region is larger than that of the substrate.

3. The method of forming a film according to claim 1, wherein the ink repellent region is a physical barrier against the first droplet.

4. The method of forming a film according to claim 1, wherein the first portion is a conductive film wiring.

5. A method of forming a film, comprising:
    disposing at least one first droplet on a substrate, the at least one first droplet including a first liquid and a solute, the first at least one droplet contacting an edge of an ink repellent region that is formed on the substrate;
    heating the substrate to evaporate the first liquid of the at least one first droplet to form a first film on the substrate, the first film formed of the solute;
    discharging at least one second droplet including a second liquid to contact the first film and dissolve at least some of the solute into the at least one second droplet;
    heating the substrate to evaporate the second liquid of the at least one second droplet to form a second film on the substrate, a shape of the first film and the second film being different; and
    repeating the step of discharging at least one second droplet and the step of heating the substrate step to evaporate the second liquid of the at least one second droplet one after the other to divide the second film into a first portion and a second portion, the first and the second portions not contacting each other, and the first portion contacting the edge of the ink repellent region, the first portion being formed along the edge of the ink repellent region.

* * * * *